United States Patent [19]

Lam et al.

[11] Patent Number: 4,699,449

[45] Date of Patent: Oct. 13, 1987

[54] OPTOELECTRONIC ASSEMBLY AND METHOD OF MAKING THE SAME

[75] Inventors: Dennis K. W. Lam; Robert I. MacDonald, both of Ottawa, Canada

[73] Assignee: Canadian Patents and Development Limited-Societe Canadienne des Brevets et d'Exploitation Limitée, Ottawa, Canada

[21] Appl. No.: 708,511

[22] Filed: Mar. 5, 1985

[51] Int. Cl.[4] .............................................. G02B 6/12
[52] U.S. Cl. ............................ 350/96.11; 350/96.12; 350/96.13; 350/96.15
[58] Field of Search ............... 350/96.11, 96.12, 96.13, 350/96.14, 96.15; 357/19; 250/551

[56] References Cited

U.S. PATENT DOCUMENTS

| | | | |
|---|---|---|---|
| 3,663,194 | 5/1972 | Greenstein et al. | 350/96.12 X |
| 3,716,804 | 2/1973 | Groschwitz | 332/7.51 |
| 3,879,606 | 4/1975 | Bean | 350/96.12 X |
| 3,896,305 | 7/1975 | Ostrowsky et al. | 350/96.12 X |
| 4,070,516 | 1/1978 | Kaiser | 350/96.12 |
| 4,079,404 | 3/1978 | Comerford et al. | 357/19 |
| 4,136,350 | 1/1979 | Tien | 350/96.14 X |
| 4,142,774 | 3/1979 | Wright | 350/96.12 |
| 4,169,001 | 9/1979 | Kaiser | 350/96.12 X |
| 4,186,409 | 1/1980 | McMullin | 350/96.11 X |
| 4,203,649 | 5/1980 | Velasco et al. | 350/96.14 |
| 4,286,171 | 8/1981 | Hara et al. | 250/551 |
| 4,369,371 | 1/1983 | Hara et al. | 251/551 |

OTHER PUBLICATIONS

Ranganath et al., *Appl. Phys. Lett.*, 31(12), Dec. 15, 1977, "Light Detection in Dielectric Waveguides by a Photodiode Through Direct Evanescent Field Coupling", pp. 803-806.

Matsuo et al., Department of Electrical Engineering, Faculty of Engineering Hokkaido University, Sapporo 060, Jul. 21, 1984, "Monolithic Integration of GaAs Photoconductive Detectors and MESFETS with Distributed Coupling to Optical Fibers", pp. L648-L650.

*Primary Examiner*—William L. Sikes
*Assistant Examiner*—Frank González

[57] ABSTRACT

An optoelectronic assembly for converting a signal between optical and electrical form, or vice versa, consists of a dielectric substrate and a semiconductor substrate. These substrates are fabricated separately and then brought together with major faces in intimate contact with each other. The dielectric substrate has a pair of metallic electrodes on its surface and a waveguide extending to a coupling region. The semiconductor substrate has an active optoelectronic device, e.g. a photodetector or light emitting device, whose optically active portion is brought into optically coupling relationship with the coupling region of the waveguide. At the same time electrically contacting regions of the optoelectronic device are placed in electrical contact with respective ones of the pair of metallic electrodes on the dielectric substrate. In addition to the advantage of separate fabrication of the two substrates, with consequent avoidance of the process incompatabilities that arise when trying to form optical and electronic elements on the same substrate, the invention is especially well suited to the formation of large scale integrated optoelectronic circuits and switching networks.

10 Claims, 14 Drawing Figures

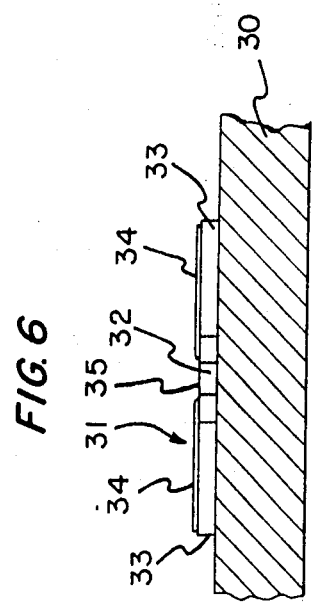
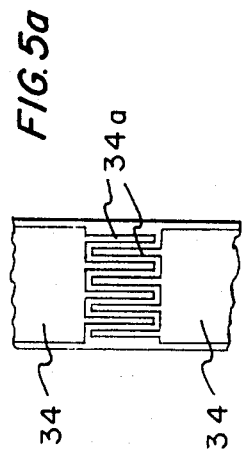
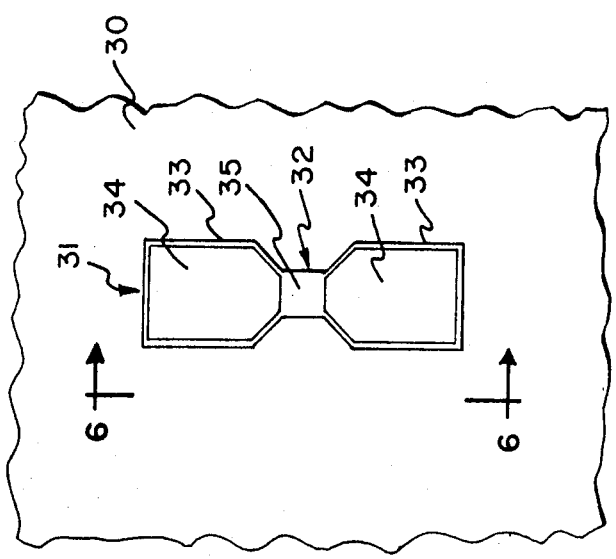
FIG. 6
FIG. 5a
FIG. 5

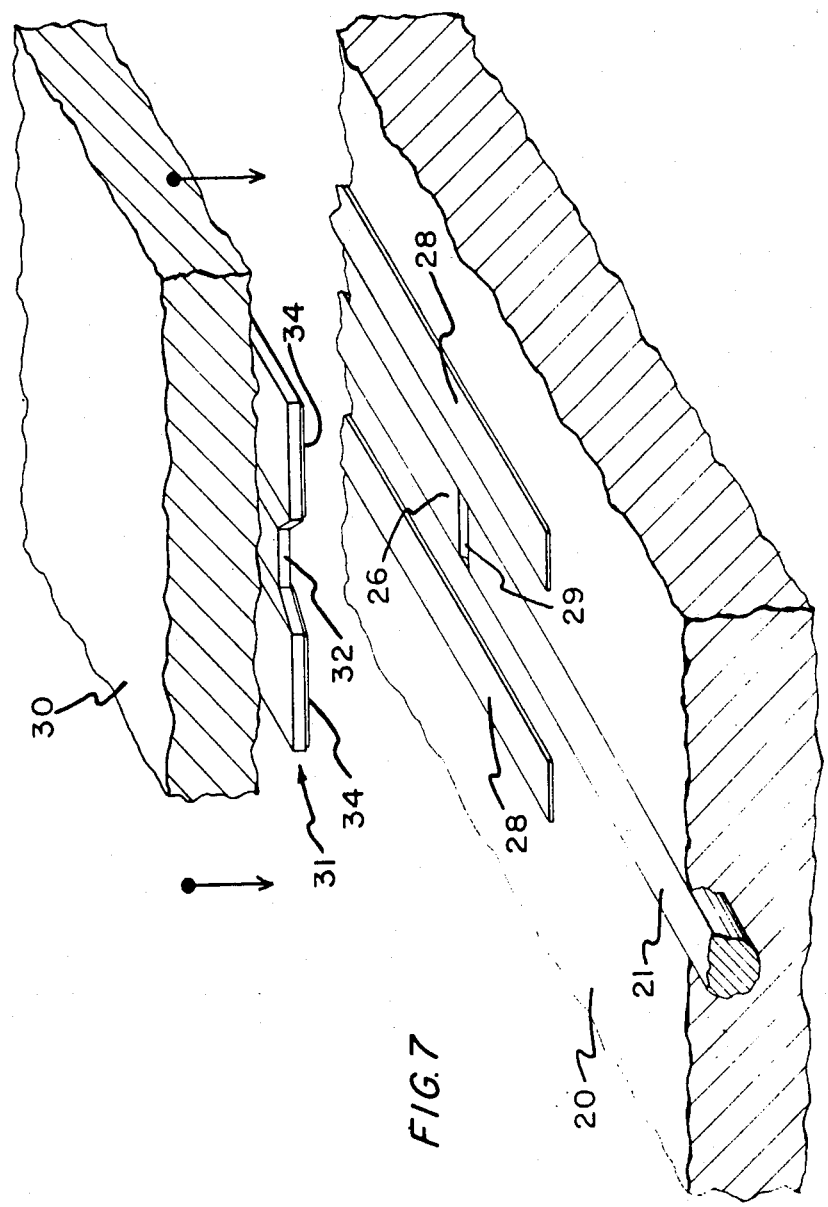

OPTOELECTRONIC ASSEMBLY AND METHOD OF MAKING THE SAME

BACKGROUND OF THE INVENTION

This invention relates to an optoelectronic assembly for converting a signal in either direction between an optical form and an electrical form. Such conversions are, of course, known. A laser or other light source can convert an electrical signal to an optical one and a photodiode or other potosensitive device can convert an opticalsignal into an elec tricalone. These devices fulfill such functions generally satisfactorily on a one-to-one basis, but the interconnection of both optical and electrical signals has not as yet been effectively embodied in an integrated circuit.

With this problem in view the present invention is concerned with an improved method of interconnecting both optical and electrical signals that will lend itself to the development of large scale integrated optoelectronic circuits and switching networks, thus introducing into the field of optical transmission many of the well known advantages associated with large scale integrated electronic circuits.

Prior Art

Past attempts to fabricate optical analogies of integrated electronic circuits have presented major difficulties, especially in the area of achieving efficient coupling between laser sources, detectors, waveguides optical fibres. There have been proposals for end butting or fusion splicing a large number of optical fibres to an array of detectors, but this has proved very difficult to achieve in practice and has placed a severe restraint on the spacing between detectors, thus limiting the possible scale of mass integration. It was thought that this problem could be solved by direct deposition of slab waveguides over a detector array on a semiconductor substrate, but in pracatice major difficulties have been encountered, arising from the fact that the processing steps for dielectric optical waveguides are largely incompatible with those for semiconductor devices. Extreme care during processing has been required to ensure that the various processing steps employed in fabricating the dielectric waveguides and semicondutor devices on the same chip do not interfere with or perturb earlier or later steps.

Different thermal expansion coefficients can lead to premature devices failure and lattice or surfce mismatch can induce strain to affect device performace. Moreover the different methods of processing required for dielectric and semiconducting devices are often conflicting. For instance, decomposition temperatures of the more common and popular binary, ternary and quaternary semiconductor materials are usually lower than the deposition temperature for dielectric optical waveguides. A typical example is gallium arsenide which decomposes at the relatively low temperature of 400°, while common optical waveguide material requires a higher deposition temperature than this. In addition, special etchant would have to be developed to selectively etchone particular material without affecting any other. The process of growing and processing multilayers of bascially very different materials is complicated and only a low production yield can be expected.

However, there has been proposed by T. R. Ranganth and S. Wang, in a paper entitled "Light detectiion in dielectric waveguides by a photodiode through direct evanescent field coupling." American Institute of Physics, Appl. Phys. Lett. 31 (12), 15 Dec. 1977, an assembly in which an etched mesa photodiode fabricated in silicon is evanescently coupled to a waveguide for light detection, the waveguide being formed in a dielectric substrate.

SUMMARY OF THE INVENTION

The present invention involves separately fabricating one or more optical devices on a dielectric substrate and one or more electronic devices on a semiconductor substrate and then combining these parts into an optoelectronic assembly in which the device-bearing surfaces of the two substrates are in intimate contact with each other.

More specifically, the invention employs a dielectric substrate having at least two metallic electrodes on a surface thereof and a waveguide extending through the substrate to a coupling region. The second part of the combination is a semiconductor substrate with an active optoelectronic device formed on it. If conversion of a signal is to take place from optical to electrical form, this active optoelectronic device will be a photodiode or other photosensitive element; if the conversion is to be from an electrical to an optical signal, the optoelectronic device will be a laser or other light emitting device. The two elements of the combination, i.e. the two substrates, are then brought together in such a way that an optically active portion of the optoelectronic is optically coupled with the coupling region of the waveguide, and with the electrically contacting regions of the optoelectronic device in elecrical contacta with the electrodes on the dielectric substrate.

This arrangement has an important difference from the proposal of Ranganth and Wang referred to above. In particular, in the invention the electrodes are formed on the dielectric substrate, while the Ranganth and Wang proposal forms the metallic contacts on the semiconductor substrate. The advantages of the present arrangement will be more fully descried below.

The optical connection between the optoelectronic device and the waveguide region can be by means of evanescent coupling, or, if optical contact can be made, by simple absorption, since the index of the semiconductor substrate is much higher than that of the dielectric waveguide and will cause the modes to become unbound in regions where the two touch. As an alternative, a perturbation can be introduced into the waveguide to couple a portion of the propagating light into the detector. This arrangement facilitates the attachment of the detector to the substrate because the close contact required to achieve frustrated total internal reflection is not necessary, although the efficiency is reduced. Air, or a low index cladding layer can separate the two substrates elsewhere.

While the foregoing explanation of the invention in its broad scope has referred only to a single waveguide associated therewith, it is envisaged that in practice there will likely be a large number of such coupled elements on each substrate. The waveguide acts as a medium that allows ease of large scale optical connection. By fabricating the waveguide and optoelectronic devices separately (in each case using standard fabrication techniques), conflict of materials and processing steps can be avoided.

Thus an important advantage of this hybrid assembly is that it permits large scale integration to be achieved. Applications in optoelectronic switching are foreseen, since the technique provides a good method for interfacing optical sources with detector arrays. Multi-switching can also be achieved by fabricating different optical waveguide patterns and altering the contact position of the detector array automatically by precision stepping motors.

An important ingredient in achieving such large scale integration is the arrangement of the electrodes on the dielectric substrate, because this arrangement enables semiconductor chips of small size and low cost to be used as the semiconductor substrates. The semiconductor chips do not have to have at least one dimension larger than that of the dielectric substrate (illustrated as an overhanging structure in the Ranganath and Wang paper) in order to allow for electric contacts to be made. Furthermore, the use of small semiconductor chips, with the metallic contact and waveguide patterns on the dielectric substrate, means that the chips can be moved around to mate with different metallic contact and waveguide patterns, so that different signal processing functions can be achieved. The feasibility of gating a fixed and uncommitted array of detectors, lasers or other active or passive semiconductor components with different metallic contact and waveguide patterns can therefore be realized. A totally integrated optoelectronic assembly with light coupling to and from the optical waveguides, as well as signal routing on the dielectric substrate, can therefore be achieved. An optical repeater, a multiplexer and a demultiplexer are some possible applications. Finally, it will be apparent that having one or more small chips completely surrounded by the dielectric substrate will lead to easier packaging and better mechanical stability.

A further advantage of the present approach is that, whereas semiconductor devices are expensive and difficult to fabricate, optical waveguides are fairly straightforward and cheap to make. Therefore considerable amount of expense and effort can be saved by using a fixed, uncommitted network of semiconductor devices on a semiconductor substrate with various optical waveguide patterns on a dielectric substrate to achieve different signal processing functions. This contrasts with the currently common approach of monolithic multilayers of semiconductor and dielectric materials, which does not allow for any change in the signal paths. By using a photolithographic mask aligner to re-position the semiconductor wafer witah respect to the dielectric wafer, different waveguide patterns can be employed to achieve different functions. By fabricating different waveguide patterns, various functions can be obtained from a single uncommited array of optoelectronic devices, thus providing an optoelectronic equivalent to the "gate arrays" used to make customized logic in silicon. In principle, active switching of the optical path can be achieved in the optical waveguide layer. Multiple switching in two dimensions can therefore be achieved and this implies improvement in operational efficiency and simplicity. It also means that programmable interconnection of devices for adaptive signal processing can be achieved. The merit of the present hybrid approach is to be able to achieve effcient optoelectronic interconnection in a large scale assembly with programmable ability, without resorting to difficult and complicated fabricating methods. It makes use of two well established technologies in dielectric and semiconductor material fabrication and processing.

Moreover, as already explained, the present invention provides essentially a reversible system capable of conversion of a signal either from optical to electrical form or from electrical to optical form. This reversibility is absent from the Ranganath and Wang proposal in which the input is light and the output is electrical.

BRIEF DESCRIPTION OF THE DRAWINGS

In the drawings:

FIG. 5 is a plan view of a portion of a semiconductor substrate adapted to form the second part of the assembly;

FIG. 5a shows an alternative to FIG. 5;

FIG. 6 is a section on 6—6 in FIG. 5;

FIG. 7 is an exploded perspective view demonstrating how the two elements are combined to form the assembly;

DETAILED DESCRIPTION OF THE PREFERRED EMBODIMENTS

Figures 1, 2, 3, 4, 4A:
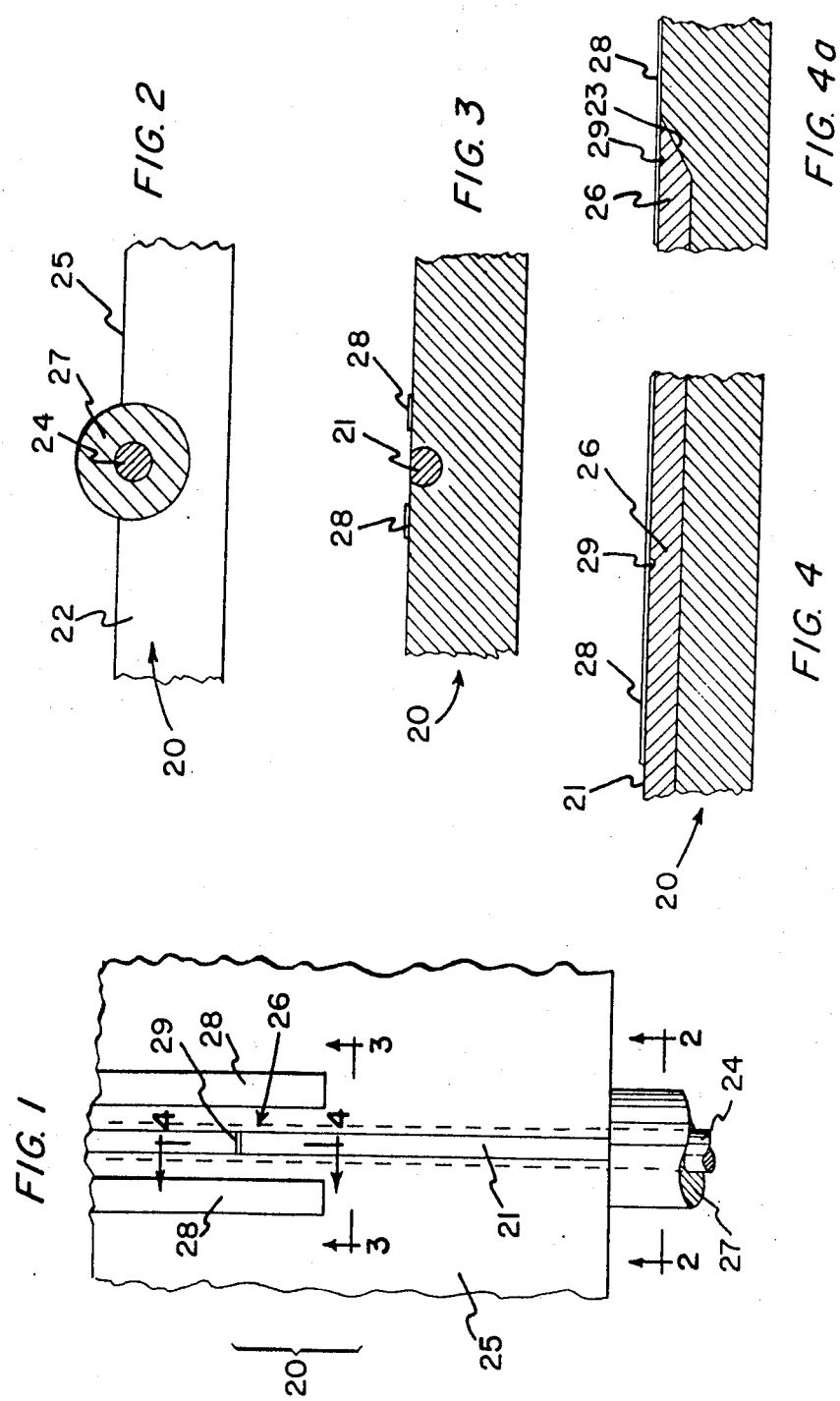
FIG. 1 is a plan view of a portion of an dielectronic substrate adapted to form a first part of an optoelectronic assembly in accordance with an embodiment of the present invention.
FIGS. 2, 3 and 4 are respectively fragmentary cross-sections taken on lines 2—2; 3—3 and 4—4of FIG. 1.
FIG. 4a shows an alternative to FIG. 4.

A dielectric substrate 20 (FIGS. 1-4) of soda lime glass or other suitable material, such as quartz glass or lithium niobate, is formed with a waveguide 21 by a known technique, e.g. diffusion of silver into the glass. Using glass, the refractive index of the waveguide 21, e.g. 1.55, will thus be made slightly higher than that of the substrate 20, e.g. 1.52. The preferred shape for the waveguide 21 to begin at a substrate end face 22 with a substantially circular cross-section for conventient coupling to the core 24 of an optical fibre that includes cladding 27, while being located adjacent a major substrate surface 25. Also deposited on the surface 25 by a standard vaccum evaporation technique or by RF/DC sputter deposition is a pair of metallic electrodes 28. A perturbation in the form of a shallow groove 29 is formed in a waveguide region 26 located between the elecrodes 28. The perturbation can take other forms, such as a ridge, lateral deformation, surface corrugation, a ramp 23 terminating the waveguide as shown in FIG. 4a or a local alteration of the refractive index of the waveguide.

A semiconductor substrate 30 of a suitable material, such as gallium arsenide, (FIGS 5 and 6) is formed in a conventional manner with a mesa 31, a central portion of which is narraowed to a neck 32. The end portions 33 of the mesa are coated with a thin film 34 of metal, e.g. an alloy of gold and germanium. While the substrate 30 will be doped with a suitable material, such as chromium, to render it "semi-insulating," the mesa 31 will consist of undoped semiconducting gallium arsenide. This arrangement is a known form of photoconductor.

Light impinging on the exposed surface 35 of the neck 32 changes the conductance of this neck and hence, when a voltage is applied across the two metallic films 34, any signal modulating the light will be converted into a corresponding electrical signal.

Figure 8:
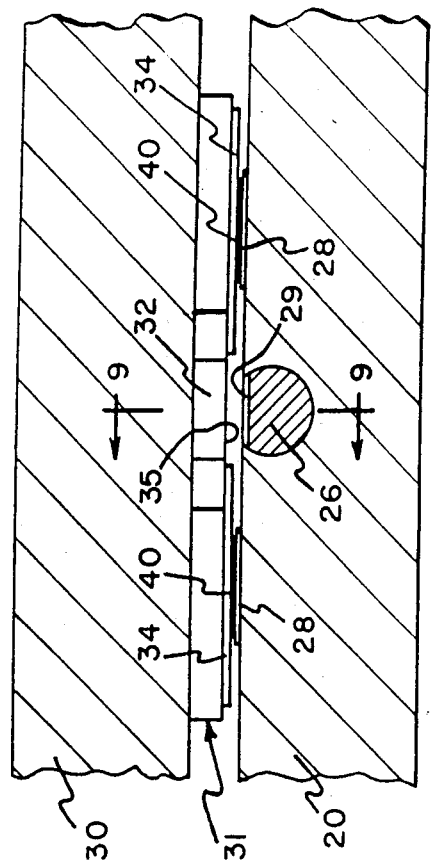
FIG. 8 is a cross-section through this assembly.
Figure 9:
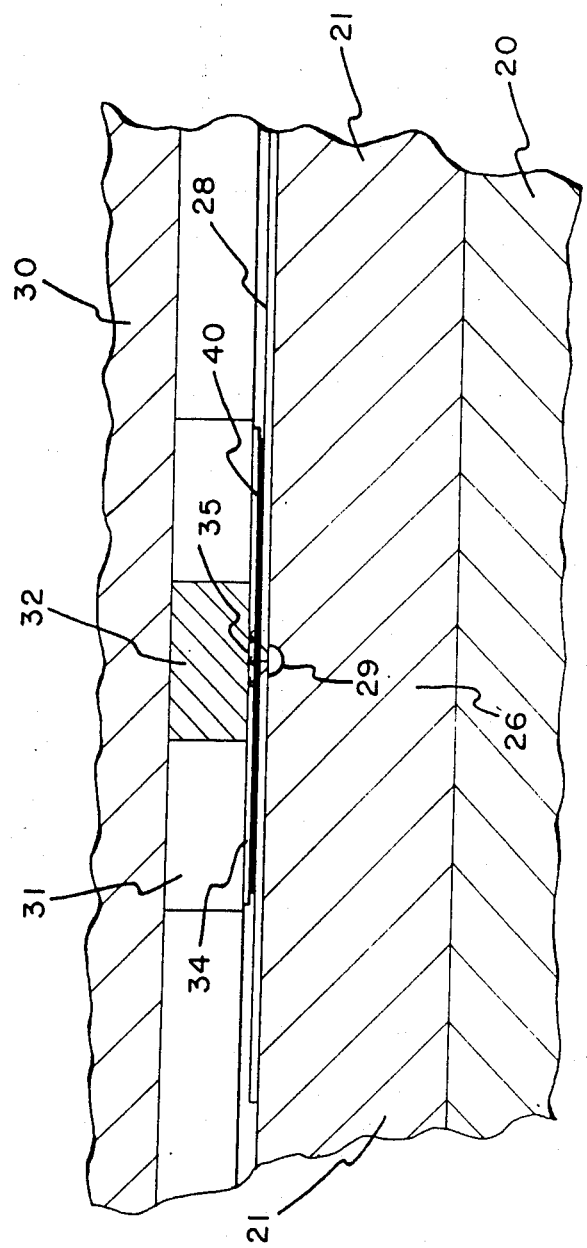
FIG. 9 is a cross-section taken on the line 9—9 in FIG. 8.

To construct an opotoelectronic assembly according to the invention, the semiconductor substrate 30 is inverted and placed face downwards on the dielecric substrate 20, as demonstrated diagrammatically by FIG. 7 and shown in the completed condition in FIGS. 8 and 9, i.e. with the outer surface 35 of the mesa neck 32 directly overlying the perturbation 29 in the waveguide coupling region 26. Each metallic film 34 thus constitutes an elecrically contacting region that makes electrical contact with a respective electrode 28. If the two substrates are to be permanently fixed together in this orientation, a thin layer 40 of solder can be used to secure each film 34 to an electrode 28.

Since it is impossible to illustrate structures of this type with any accurate reference to scale, a few typical dimensions that are envisaged will now be listed, although it is to be understood that the invention in its broad scope will permit of wide variations in the is regard Diameter of the waveguide portion 20—50$\mu$ Depth of the perturbation 29 –13 a few $\mu$ Mesa height—2 to 3 $\mu$ Active area of the meas, i.e. the neck 32—10 to 50$\mu$ square for a single channel device (FIG. 5 or 100$\mu$ square with 3 to 10$\mu$ finger spacings for an interdigitated device as shown in FIG. 5$a$ where the films 34 have spaced apart, parallel, interlocking fingers 34$a$.

Metallic films 34 on the mesa and the electrodes 28 on the substrate 20—0.1 or 0.2$\mu$ thick.

The perturbation 29 constitutes means for decoupling from the waveguide light propagating along the waveguide and for deflecting at least some of such decoupled light into a direction generally perpendicular to the surface, as indicated by the arrows in FIG. 9, and some of such deflected light will impinge on the surface 35 of the neck 32 of the photoconductor. To maximise this optical coupling, the distance between the outer surface of the waveguide region 26 and the photosensitive surface 35 should be kept to a minimum commensurate with practical construction considerations. A satisfactory optical coupling can readily be achieved with the typical dimensions mentioned above. If desired, a reflecive metal film can be formed on the downstream edge of the perturbation 29 to improve the coupling.

A better but more difficult way to couple these surface is with direct optical contact, dispensing with the perturbation 29 and relying on frustrated total internal reflection. In this case the tolerance for the spacing between the waveguide and photosensitive surface is reduced to a few times the wavelength of the light employed. This light will normally be in the infra-red region, i.e. from 0.8 to 1.3$\mu$ and hence 3 to 5$\mu$ will be about the maximum spacing acceptable. Because gallium arsenide has a high refractive index (about 3.65), the light is readily coupled into the active portion 32 of the photoconductor, thus converting the optical signal to an electrical one.

The particular photosensitive device shown formed on the semiconductor substrate 30 can be replaced by any other known type of photodetector, provided the structure of such device lends itself to forming an assembly with a dielectric substrate containing a waveguide.

Moreover, if the photosensitive device is replaced by a light emitting device, e.g. a laser, the direction of signal transmission is reversed. In other words, the semiconductor substrate carries an active optoelectronic device, that is to say either a device capable of converting a signal from optical to elecrically form or vice versa.

Figure 11:
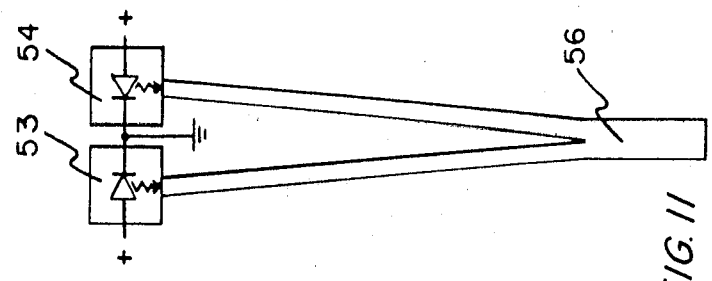
FIGS. 10 and 11 are diagrams illustrating alternative methods of distributing optical power.
Figure 10:
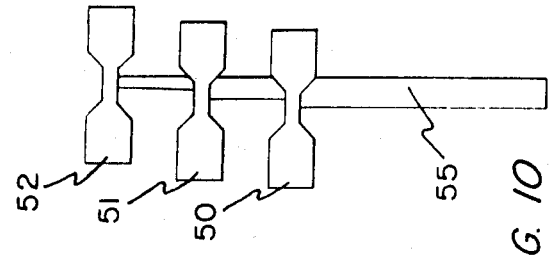

The most important practical application of the basic structure described and illustrated is expected to be in the realm of large scale integrated optoelectronic circuits (analagous to integrated electronic circuits) capable of broadband switching. A single semiconductor substrate can be expected to be able to carry a large number of active optoelectronic devices each coupling with a different waveguide region in the dielectric substrate. FIG. 10 shows a simple arrangement for coupling more than one active optoelectronic device, e.g. photodetectors, 50–52 to waveguide 55 and to extended portions of this waveguide, respectively, each optoelectronic device 50-52 coupling, as before, to a respective coupling region on the waveguide. This wave guide diminishes in cross-section beyond each device. FIG. 11 shows a forked waveguide 56 each part of which receives light from a respective light emitting device 53, 54.

The electrodes on the surface of the dielectric substrate can be externally connected as a matrix or otherwise to enable only selected ones to be energised for switching control.

Since the formation of a photodiode and a laser on the same semiconductor substrate enables an electrical signal to be converted into an optical one and back to an electrical one, or conversely from optical, through electrical, back to optical, the assembly can act as an amplifier as well as a switch.

While in the example illustrated the two substrates are permanently connected together by means of the solder between the metallic films and electrodes, a similar effect can be achieved by externally clamping the two substrates together. Such an arrangement permits changes to be made, e.g. one semiconductor substrate with a particular array of active optoelectronic devices on it to be substituted for another substrate having a different array, or for the same semiconductor substrate to be moved around among various different positions on the dielectric substrate, thus achieving the ability to perform switching under mechanical as well as electrical control.

Figure 12:
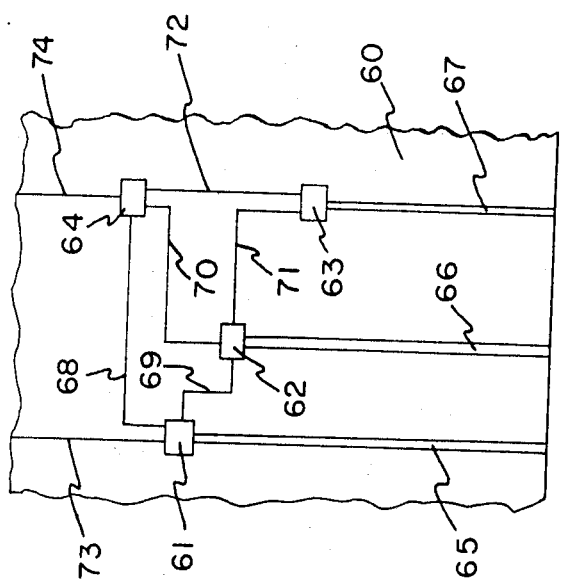
FIG. 12 is a plan view of an ararangement employing a number of assemblies in accordance with the invention.

FIG. 12 illustrates part of a dielectric substrate 60 on which a series of semiconductor chips 61 to 64 are arranged. The chips 61 to 63 are each coupled to a respective waveguide 65, 66 or 67, and the chips and leads interconnected by a pattern of metallic contacts and leads 68 to 72, all formed on the dielectric substrate 60. Leads 73 and 74 are provided for introducing an external power supply. Depending on the nature of the chips, this arrangement could, for example, constitute an optical repeater or an optical switch.

We claim:

1. An optoelectronic assembly comprising
   (a) a dielectric substrate having at least two metallic electrodes on a surface thereof, and a waveguide formed in said substrate to extend through the substrate parallel to and adjacent said surface,
   (b) said waveguide having a coupling region formed by means for decoupling from the waveguide light propagating along said waveguide and for deflecting at least some of such decoupled light into a direction generally perpendicular to said surface, (c) a semiconductor substrate having an active optoelectronic device thereon; and (d) means for locating said substrates in a relative position in which an optically active portion of said optoelectronic device is optically coupled with said coupling region of the waveguide to receive such deflected light, and with electrically contacting regions of said optoelectronic device in electrical contact with said electrodes of the dielectric substrate.

2. An optoelectronic assembly according to claim 1 wherein said waveguide has an extended portion extending beyond said coupling region through the dielectric substrate parallel to and adjacent said surface, said decoupling and deflecting means being such that only part of the light propagating in the waveguide is deflected to couple optically with said optically active portion of said optoelectronic device, the remainder of said light in the waveguide continuing to propagate in said extended portion thereof.

3. An optoelectronic assembly according to claim 2, wherein said extended portion of the waveguide has a further coupling region formed by means for decoupling from said extended portion the light propagating along said extended portion and for deflecting at least some of the light decoupled at said further coupling region into a direction generally perpendicular to said surface, and wherein said semiconductor substrate has a further optoelectronic device thereon having an optically active portion optically coupled with said further coupling region to receive the light deflected at said further coupling region.

4. An optoelectronic assembly according to claim 1, wherein said active optoelectronic device is a photosensitive device.

5. An optoelectronic assembly according to claim 1, wherein said active optoelectronic device is a light emitting device.

6. An optoelectronic assembly according to claim 1, wherein said means for locating said substrates in said relative position comprises means mechanically interconnecting said electrically contacting regions of the optoelectronic device and said electrodes on the dielectric substrate.

7. An optoelectronic assembly according to claim 1, wherein said waveguide coupling region and said optically active portion of the optoelectronic device are substantially in direct contact.

8. An opeoelectronic assembly according to claim 4, wherein said photosensitive device is formed in an electrically isolalted region on the semiconductor substrate, said device having a central portion constituting said optically active portion and end portions clad with metallic films to constitute said electrically contacting regions.

9. An optoelectronic assembly according to claim 1, wherein a plurality of semiconductor chips each having an active optoelectronic device thereon are disposed on said dielectric substrate, with each such optoelectronic device optically coupled to a coupling region of a waveguide formed in the dielectric substrate, and with said chips interconnected with each other and connected to the exterior by metallic leads formed on the dielectric substrate and electrically connected to the electrically contacting regions of the respective optoelectronic devices.

10. A method of making an optoelectronic assembly comprising the steps of:

(a) separately fabricating a dielectric substrate and a semiconductor substrate, (i) said dielectric substrate being formed with at least two metallic electrodes on a surface thereof and a waveguide extending through the dielectric substrate parallel to and adjacent said surface, said waveguide having a coupling region formed by means for decoupling from the waveguide light propagating along said waveguide and for deflecting at least some of such decoupled light into a direction generally perpendicular to said surface, and (ii) said semiconductor substrate having an active optoelectronic device thereon, said optoelectronic device having an optically active portion and electrically contacting regions, and (b) assembling said substrates in intimate contact with each other with the optically active portion of the optoelectronic device optically coupled with said coupling region of the waveguide, and with the electrically contacting regions of the optoelectronic device in electrical contact with respective ones of said electrodes of the dielectric substrate.

* * * * *